United States Patent
Iwamizu

(10) Patent No.: US 12,021,528 B2
(45) Date of Patent: Jun. 25, 2024

(54) SEMICONDUCTOR DEVICE

(71) Applicant: FUJI ELECTRIC CO., LTD., Kawasaki (JP)

(72) Inventor: Morio Iwamizu, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/874,810

(22) Filed: Jul. 27, 2022

(65) Prior Publication Data
US 2023/0073508 A1    Mar. 9, 2023

(30) Foreign Application Priority Data
Sep. 9, 2021 (JP) .................................. 2021-147077

(51) Int. Cl.
*H03K 3/01* (2006.01)
*H03K 17/687* (2006.01)

(52) U.S. Cl.
CPC ............ *H03K 3/01* (2013.01); *H03K 17/687* (2013.01)

(58) Field of Classification Search
CPC .............................. H03K 17/687; H03K 3/01
USPC ....................................................... 327/109
See application file for complete search history.

(56) References Cited

U.S. PATENT DOCUMENTS

2007/0279119 A1* 12/2007 Onozawa ........... H03K 17/0828
                                                        327/434
2013/0021083 A1    1/2013 Furuya et al.
2016/0311327 A1* 10/2016 Nakahara ........... H03K 17/0822

FOREIGN PATENT DOCUMENTS

JP          2003-070233 A     3/2003
JP          2013-026838 A     2/2013

* cited by examiner

*Primary Examiner* — Diana J. Cheng
(74) *Attorney, Agent, or Firm* — Rabin & Berdo, P.C.

(57) ABSTRACT

A semiconductor device for driving an inductive load. The semiconductor device includes an output-stage switch connected to the inductive load for operating the inductive load; a voltage detection circuit configured to output a detection signal responsive to an overvoltage being higher than or equal to a clamp voltage; a drive circuit configured to apply a drive signal having a first threshold voltage to a gate of the output-stage switch, responsive to the overvoltage being lower than the clamp voltage, to turn on the output-stage switch; and a voltage application circuit configured to apply a voltage signal having a second threshold voltage higher than the first threshold voltage to the gate of the output-stage switch, responsive to the overvoltage being higher than or equal to the clamp voltage and upon receiving the detection signal from the voltage detection circuit, to turn on the output-stage switch.

5 Claims, 13 Drawing Sheets

SEMICONDUCTOR DEVICE

CROSS-REFERENCE TO RELATED APPLICATION

This application is based upon and claims the benefit of priority of the prior Japanese Patent Application No. 2021-147077, filed on Sep. 9, 2021, the entire contents of which are incorporated herein by reference.

BACKGROUND OF THE INVENTION

1. Field of the Invention

The embodiment discussed herein relates to a semiconductor device which drives an inductive load with a semiconductor switching element.

2. Background of the Related Art

In recent years, the development of a semiconductor device which is referred to as an intelligent power switch (IPS) and in which a switching element using a power semiconductor element, a drive circuit for the switching element, a peripheral protection circuit, and the like are formed on one chip has progressed.

IPSes are widely used in vehicle electrical systems, such as transmissions, engines, and brakes, and products which realize miniaturization, high performance, and high reliability are needed.

FIG. 7 illustrates an example of the structure of a conventional IPS. FIG. 7 illustrates a rough circuit structure of the vicinities of an output stage of the IPS (protection circuit and the like are not illustrated). An IPS 30 has an OUT terminal, an IN terminal, and a GND terminal. An inductive load 2 is connected to the OUT terminal. The inductive load 2 is, for example, a solenoid valve widely used in a vehicle (hereinafter the inductive load 2 may be referred to as an L load 2). A central processing unit (CPU) (not illustrated) is connected to the IN terminal and a control signal outputted from the CPU is inputted to the IN terminal. Ground (GND) is connected to the GND terminal.

The IPS 30 includes a drive circuit 31, a constant-current source I0, diodes d0, d1, and d2, and an output-stage switch m0 which is an n-channel metal-oxide-semiconductor field-effect transistor (MOSFET).

Each element is connected in the following way. The IN terminal is connected to an input terminal of the drive circuit 31. The OUT terminal is connected to a cathode of the diode d0, a drain of the output-stage switch m0, a cathode of the diode d1, and one terminal of the L load 2. The other terminal of the L load 2 is connected to the GND. An anode of the diode d1 is connected to an anode of the diode d2.

A cathode of the diode d2 is connected to an output terminal of the drive circuit 31, an input terminal of the constant-current source I0, and a gate of the output-stage switch m0. The GND terminal is connected to a GND terminal of the drive circuit 31, an output terminal of the constant-current source I0, a source of the output-stage switch m0, and an anode of the diode d0.

When an H-level control signal transmitted from the CPU is inputted to the IN terminal, the drive circuit 31 outputs an H-level signal to the gate of the output-stage switch m0 to turn on the output-stage switch m0. Furthermore, when an L-level control signal transmitted from the CPU is inputted to the IN terminal, the drive circuit 31 outputs an L-level signal to the gate of the output-stage switch m0 to turn off the output-stage switch m0.

The output-stage switch m0 is a switching element used for controlling a current flowing through the L load 2. As illustrated in FIG. 7, the diode d0 is connected to the output-stage switch m0. At the time when the output-stage switch m0 is turned off, back electromotive force is generated in the L load 2. Accordingly, the diode d0 is connected in inverse parallel with the output-stage switch m0 and functions as a free wheeling diode (FWD) which circulates a current flowing through the L load 2 at this time.

On the other hand, the diode d1 functions as a clamp diode which protects the output-stage switch m0 against an overvoltage generated due to the inductance of the L load 2 at the time of the output-stage switch m0 being turned off. The diode d2 functions as a reverse-current prevention diode.

The following technique is proposed as a related art. A current flowing through a switching element is controlled by amplifying a voltage across a resistor used for detecting a current flowing through a diode which breaks down due to a voltage across the switching element and the continuity of the switching element is controlled according to a voltage across the resistor (see, for example, Japanese Laid-open Patent Publication No. 2013-26838).

Furthermore, the following technique is proposed. A switching control circuit which outputs a gate drive signal to a gate of an insulated gate element and a gate potential control circuit which controls a gate potential so as to discharge the gate in the process of the insulated gate element being turned on and so as to charge the gate in the process of the insulated gate element being turned off are included to perform gate drive (see, for example, Japanese Laid-open Patent Publication No. 2003-70233).

FIG. 8 illustrates an example of an operational waveform of the conventional IPS. FIG. 8 illustrates an operational waveform of the above IPS 30 at the time of a voltage across the L load 2 being clamped. With graph g1, a vertical axis indicates voltage, a horizontal axis indicates time, and the waveform of a voltage signal VIN at the IN terminal is indicated. With graph g2, a vertical axis indicates current, a horizontal axis indicates time, and the waveform of a current signal IOUT flowing from the OUT terminal to the output-stage switch m0 is indicated. With graph g3, a vertical axis indicates voltage, a horizontal axis indicates time, and the waveform of a voltage signal VOUT at the OUT terminal is indicated.

(Period t1) The voltage signal VIN is at an L level. At this time the gate of the output-stage switch m0 is at an L level. Accordingly, the output-stage switch m0 is in an off state. Because the output-stage switch m0 is in an off state, the current signal IOUT does not flow. Furthermore, a battery is located on the upper side of the L load 2. As a result, even when the output-stage switch m0 is in an off state, a voltage of 12 volts from the battery is applied to the OUT terminal. Accordingly, the voltage of the voltage signal VOUT is 12 volts.

(Period t2) The voltage signal VIN is at an H level (has a voltage of, for example, 5 volts). At this time the gate of the output-stage switch m0 is at an H level. Accordingly, the output-stage switch m0 is in an on state. Because the output-stage switch m0 is in an on state, the current signal IOUT flows from the L load 2 to the OUT terminal and increases. Furthermore, because the output-stage switch m0 is in an on state, the on-state resistance value of the output-stage switch m0 approaches to 0. Because V=IR, the voltage of the voltage signal VOUT falls to a GND level.

(Period t3) The voltage signal VIN is at an L level. At this time the gate of the output-stage switch m0 is at an L level. Accordingly, the output-stage switch m0 is in an off state. The current signal IOUT flowing from the L load 2 to the OUT terminal takes a direction in which it is cut off. As a result, the current signal IOUT decreases.

On the other hand, the L load 2 is connected to the OUT terminal. When the output-stage switch m0 makes the transition from the on state to the off state to cut off the flow of the current signal IOUT, a current flowing through the L load 2 attempts to maintain the flow. As a result, back electromotive force is generated in the L load 2 in a direction that passes the current signal IOUT. As a result, the voltage signal VOUT rises. In the example of FIG. 8, the voltage signal VOUT rises to a voltage of 50 volts.

A peak voltage of 50 volts applied in period t3 between the OUT terminal and the GND is a clamp voltage. This clamp voltage depends on the breakdown voltage of the diode d1 and the threshold voltage of the output-stage switch m0.

It is assumed that the breakdown voltage of the diode d1 is 49 bolts, that the threshold voltage of the output-stage switch m0 is 1 volt, and that a voltage of 50 volts is applied between the OUT terminal and the GND. In this case, when the diode d1 breaks down at a voltage of 49 bolts, the current signal IOUT flows through the diode d1 in the reverse direction.

Furthermore, because a voltage of 1 volt is applied between the gate and source of the output-stage switch m0, the output-stage switch m0 is turned on and the current signal IOUT flows through the output-stage switch m0 and flows to the GND terminal. In addition, a remaining current signal IOUT which does not flow in the direction of the output-stage switch m0 flows through the diode d2 and the constant-current source I0 and flows to the GND terminal. By exercising the above control, energy stored in the inductance of the L load 2 at the time of a voltage across the L load 2 being clamped is handled (surge current at the time of a voltage across the L load 2 being clamped is handled).

(Period t4) When handling energy stored in the inductance of the L load 2 ends, the same operation that is performed during period t1 is performed.

As has been described, when the voltage signal VIN becomes an H level, the output-stage switch m0 goes into an on state and a current flows through the L load 2. When the output-stage switch m0 is in an off state, the voltage signal VOUT is raised due to back electromotive force generated in the L load 2. When the breakdown voltage of the diode d1 inserted between the drain and the gate of the output-stage switch m0 is exceeded, a current flows into the constant-current source I0 and the gate of the output-stage switch m0 and the output-stage switch m0 is put into an on state. By doing so, energy stored in the L load 2 is handled.

FIG. 9 is a view for describing an example of determining a clamp voltage. In FIG. 9, a vertical axis indicates current and a horizontal axis indicates voltage. Load curve k1 indicates fluctuations of a clamp diode (diode d1) with time and load curve k2 indicates fluctuations of the constant-current source I0 with time. A cross point of load curve k1 of the clamp diode and load curve k2 of the constant-current source I0 becomes a threshold voltage Vth of the output-stage switch m0. By doing so, a clamp voltage is determined.

When a gate voltage applied to the gate of the output-stage switch m0 is lower than a cross-point voltage, the output-stage switch m0 is not turned on. Accordingly, in period t3 the voltage signal VOUT rises from the GND to the peak voltage and increases.

Furthermore, when the gate voltage reaches the cross-point voltage, the output-stage switch m0 is turned on. Accordingly, in period t3 the voltage signal VOUT is kept at the constant peak voltage. The current signal IOUT flows along the above paths. As a result, energy stored in the L load 2 is handled.

FIG. 10 illustrates the relationship between a clamp voltage and time taken to handle energy stored in the L load. In FIG. 10, a vertical axis indicates voltage and a horizontal axis indicates time. A solid line graph g3 is the same as graph g3 illustrated in FIG. 8 and indicates a case where a clamp voltage is 50 volts. Furthermore, a dotted line graph g4 indicates a case where a clamp voltage is 30 volts. If a clamp voltage is 50 volts, then time taken to handle energy stored in the L load 2 is T1. If a clamp voltage is 30 volts, then time taken to handle energy stored in the L load 2 is T2. The time T2 is longer than the time T1 (T1<T2).

FIG. 11 illustrates the relationship between a clamp voltage and clamp resistance. In FIG. 11, a vertical axis indicates clamp resistance (mJ) and a horizontal axis indicates clamp voltage (V). Clamp resistance j1 at the time of clamp voltage=50 V is lower than clamp resistance j2 at the time of clamp voltage=30 V.

As illustrated in FIG. 10 and FIG. 11, if a clamp voltage is 50 volts, then time taken to handle energy stored in the L load 2 is short compared with a case where a clamp voltage is 30 volts. However, if energy handling is performed in a short period of time, then the output-stage switch m0 generates much heat and clamp resistance is low compared with a case where a clamp voltage is 30 volts. As a result, destruction of the element tends to occur.

On the other hand, in recent years, the amount of current per unit area of a MOSFET has increased by microfabrication in a wafer process performed for realizing low on-state resistance/A (die size). With the output-stage switch m0, for example, minute MOSes are arranged in parallel. There is variation in the threshold voltages of the minute MOSes. Even if the rated value of the threshold voltages is 1 V, some minute MOSes have threshold voltages lower than 1 V.

FIG. 12 illustrates an example of the structure of a section of the output-stage switch. With an NMOS transistor which is the output-stage switch m0, a p-type region 102 is formed over a drain layer 101 and an epitaxial layer 103 is formed over the p-type region 102. A source region 104 is formed over the epitaxial layer 103. A p$^+$-type contact region 103a is formed in the depth direction in the epitaxial layer 103. An n$^+$-type source region 103b is formed adjacently to the p$^+$-type contact region 103a. Furthermore, gate trenches gt1, ..., and gt4 are formed between n$^+$-type source regions 103b.

FIG. 13 illustrates an example of the arrangement of gate trenches of the output-stage switch. FIG. 13 illustrates the planar structure of the output-stage switch m0. The gate trenches gt1, ..., and gt4 are formed over the p-type region 102.

As illustrated in FIG. 12 and FIG. 13, the output-stage switch m0 has a structure in which a plurality of minute MOSes are arranged in parallel and has a plurality of MOS portions. Because the output-stage switch m0 has the above structure, there is variation in the thickness of a gate insulating film among the gate trenches of the plurality of MOS portions (process variation). As a result, there is variation in threshold voltage among the gate trenches of the plurality of MOS portions.

Accordingly, if a current generated due to a clamp voltage flows through the output-stage switch m0, then the following phenomenon may occur. The current flows locally and convergently through a minute MOS having a low threshold voltage. This means that energy is handled by the minute MOS having a low threshold voltage. As a result, even if the clamp voltage itself does not fall, the clamp resistance of the MOSFET lowers. Accordingly, in order to increase clamp resistance, a circuit in which energy handling is performed by gates of all the minute MOSes that make up the output-stage switch m0 (by the whole of the gate of the output-stage switch m0) is desired.

SUMMARY OF THE INVENTION

According to an aspect, there is provided a semiconductor device for driving an inductive load. The semiconductor device includes: an output-stage switch which is connected to the inductive load and which switches on and off to operate the inductive load, the output-stage switch having a gate, a drain, and a source; a voltage detection circuit configured to output a detection signal responsive to an overvoltage, corresponding to a back electromotive force generated in the inductive load at a turn-off time that follows a turn-on of the output-stage switch, being higher than or equal to a clamp voltage; a drive circuit configured to apply a drive signal having a first threshold voltage to the gate of the output-stage switch to turn on the output-stage switch; and a voltage application circuit configured to apply a voltage signal having a second threshold voltage higher than the first threshold voltage to the gate of the output-stage switch, responsive to the overvoltage being higher than or equal to the clamp voltage and upon receiving the detection signal from the voltage detection circuit, to turn on the output-stage switch.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described with reference to the accompanying drawings.

Figure 1:
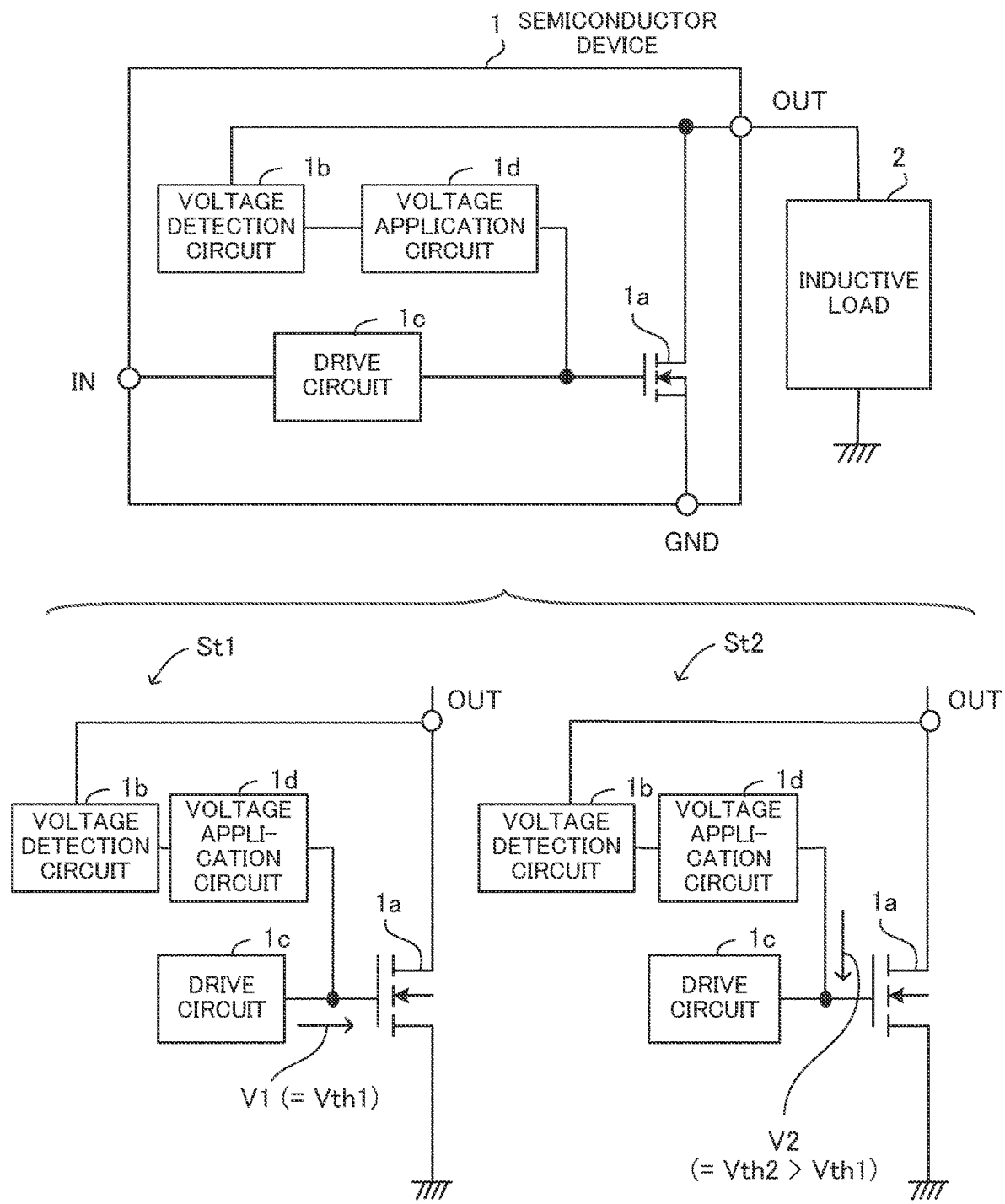
FIG. 1 is a view for describing an example of a semiconductor device according to an embodiment.

FIG. 1 is a view for describing an example of a semiconductor device according to an embodiment. A semiconductor device 1 has an OUT terminal, an IN terminal, and a GND terminal. An inductive load (L load) 2 is connected to the OUT terminal. A CPU (not illustrated) is connected to the IN terminal and a control signal outputted from the CPU is inputted to the IN terminal. GND is connected to the GND terminal. Furthermore, the semiconductor device 1 has an output-stage switch 1a, a voltage detection circuit 1b, a drive circuit 1c, and a voltage application circuit 1d. The output-stage switch 1a is, for example, an NMOS transistor.

The IN terminal is connected to an input terminal of the drive circuit 1c. The OUT terminal is connected to a drain of the output-stage switch 1a, an input terminal of the voltage detection circuit 1b, and one terminal of the L load 2. The other terminal of the L load 2 is connected to the GND. An output terminal of the voltage detection circuit 1b is connected to an input terminal of the voltage application circuit 1d. A gate of the output-stage switch 1a is connected to an output terminal of the drive circuit 1c and an output terminal of the voltage application circuit 1d. A source of the output-stage switch 1a is connected to the GND terminal. Each of the voltage detection circuit 1b, the drive circuit 1c, and the voltage application circuit 1d has a GND terminal (not illustrated) connected to the above GND terminal.

The output-stage switch 1a performs switching and operates the L load 2. If the voltage detection circuit 1b detects that an overvoltage based on back electromotive force generated in the L load 2 at turn-off time which follows a turn-on of the output-stage switch 1a is higher than or equal to a determined voltage of a clamp voltage, then the voltage detection circuit 1b outputs a detection signal. On the basis of a control signal outputted from the CPU or the like and inputted from the IN terminal, the drive circuit 1c drives the output-stage switch 1a. Furthermore, the output-stage switch 1a is controlled on the basis of the following state St1 or St2 according to a level of the overvoltage.

(State St1) State St1 is a state in which the overvoltage is lower than the determined voltage of the clamp voltages. At normal operation time, the drive circuit 1c operates in this state to apply applies a drive signal V1 having a threshold voltage Vth1 (first threshold voltage) to the gate of the output-stage switch 1a to turn on the output-stage switch 1a.

(State St2) State St2 is a state in which the overvoltage is higher than or equal to the determined voltage of the clamp voltages. In this case, the voltage application circuit 1d receives a detection signal outputted from the voltage detection circuit 1b at the time of the overvoltage becoming higher than or equal to the determined voltage, and applies a voltage signal V2 having a threshold voltage Vth2 (second threshold voltage) higher than the threshold voltage Vth1 to the gate of the output-stage switch 1a to turn on the output-stage switch 1a.

By adopting the above structure of the semiconductor device 1, the threshold voltage Vth2 higher than the threshold voltage Vth1 at normal operation time is forcedly applied to the gate of the output-stage switch 1a when a voltage across the L load 2 is clamped. By doing so, all minute MOSes which make up the output-stage switch 1a are reliably turned on and energy is handled by the whole of the gate of the output-stage switch 1a. This increases clamp resistance.

Figure 2:
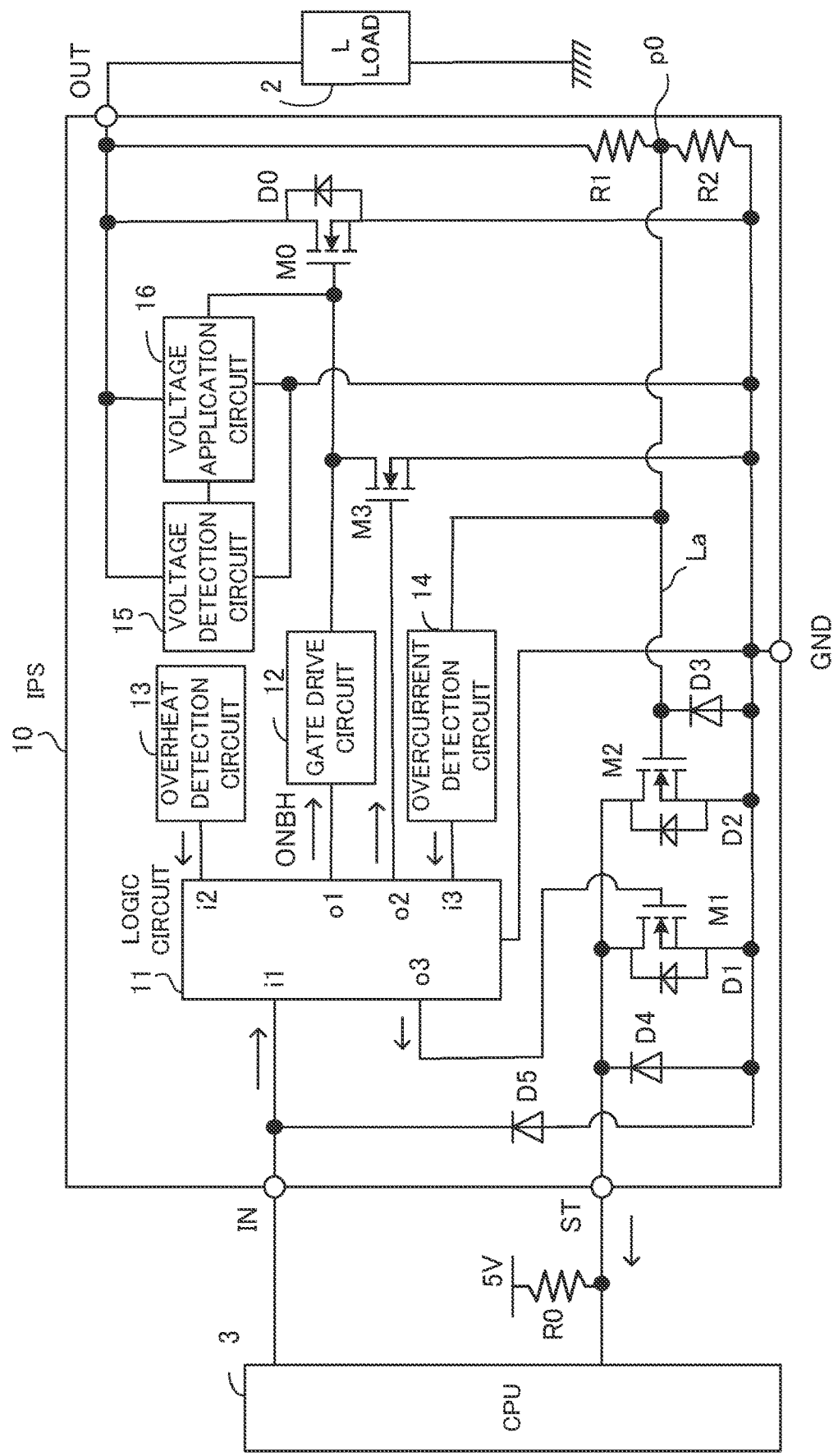
FIG. 2 illustrates an example of the structure of an IPS according to an embodiment.

FIG. 2 illustrates an example of the structure of an IPS according to an embodiment. An IPS 10 has the function of the semiconductor device 1 illustrated in FIG. 1. FIG. 2 illustrates the structure of a low-side IPS. However, the basic structure of a high-side IPS is also the same. The IPS 10 has an OUT terminal, an IN terminal, an ST terminal, and a GND terminal as an external connection terminal.

The OUT terminal is used for outputting a signal for driving an L load 2. The IN terminal is used for inputting a control signal outputted from a CPU 3. The ST terminal is used for informing the CPU 3 of an internal state (such as an overheat state or an overcurrent state) of the IPS 10.

Furthermore, the IPS 10 includes a logic circuit 11, a gate drive circuit 12, an overheat detection circuit 13, an overcurrent detection circuit 14, a voltage detection circuit 15, and a voltage application circuit 16. The voltage detection circuit 15 has the function of the voltage detection circuit 1b illustrated in FIG. 1 and the voltage application circuit 16 has the function of the voltage application circuit 1d illustrated in FIG. 1.

In addition, the IPS 10 includes diodes D0, . . . , and D5, resistors R1 and R2, an output-stage switch M0, and NMOS transistors M1, M2, and M3. The output-stage switch M0 corresponds to the output-stage switch 1a illustrated in FIG. 1. The diode D1 is incorporated in the NMOS transistor M1 and the diode D2 is incorporated in the NMOS transistor M2.

A method for connecting each component will be described. The IN terminal is connected to an output terminal of the CPU 3, a cathode of the diode D5, and an input terminal i1 of the logic circuit 11. The ST terminal is connected to an input terminal of the CPU 3, one terminal of the resistor R0, a cathode of the diode D4, a cathode of the diode D1, a drain of the NMOS transistor M1, a cathode of the diode D2, and a drain of the NMOS transistor M2. The other terminal of the resistor R0 is connected to a 5-volt power source.

The GND terminal is connected to an anode of the diode D5, an anode of the diode D4, an anode of the diode D1, a source of the NMOS transistor M1, an anode of the diode D2, a source of the NMOS transistor M2, an anode of the diode D3, and a GND terminal of the logic circuit 11. Furthermore, the GND terminal is connected to a source of the NMOS transistor M3, a GND terminal of the voltage detection circuit 15, a GND terminal of the voltage application circuit 16, a source of the output-stage switch M0, an anode of the diode D0, and one terminal of the resistor R2.

The OUT terminal is connected to one terminal of the L load 2, one terminal of the resistor R1, a cathode of the diode D1, a drain of the output-stage switch M0, an input terminal of the voltage detection circuit 15, and one input terminal of the voltage application circuit 16. The other terminal of the L load 2 is connected to the GND. An output terminal of the voltage detection circuit 15 is connected to the other input terminal of the voltage application circuit 16.

An input terminal i2 of the logic circuit 11 is connected to an output terminal of the overheat detection circuit 13 and an input terminal i3 of the logic circuit 11 is connected to an output terminal of the overcurrent detection circuit 14. An output terminal o1 of the logic circuit 11 is connected to an input terminal of the gate drive circuit 12 and an output terminal o2 of the logic circuit 11 is connected to a gate of the NMOS transistor M3. An output terminal o3 of the logic circuit 11 is connected to a gate of the NMOS transistor M1.

An output terminal of the gate drive circuit 12 is connected to a drain of the NMOS transistor M3, an output terminal of the voltage application circuit 16, and a gate of the output-stage switch M0. An input terminal of the overcurrent detection circuit 14 is connected to a gate of the NMOS transistor M2, a cathode of the diode D3, the other terminal of the resistor R1, and the other terminal of the resistor R2.

When the logic circuit 11 receives an H-level control signal inputted from the IN terminal, the logic circuit 11 outputs an ON By H (ONBH) signal for turning on the output-stage switch M0. The gate drive circuit 12 generates a signal obtained by boosting the voltage of the ONBH signal outputted from the logic circuit 11 to a level at which the output-stage switch M0 is turned on at normal operation time, and applies the signal to the gate of the output-stage switch M0. Furthermore, the logic circuit 11 recognizes in block state detection signals outputted from the overheat detection circuit 13 and the overcurrent detection circuit 14.

When the temperature of the output-stage switch M0 is abnormally higher than a rated temperature, the overheat detection circuit 13 transmits an abnormal signal to the logic circuit 11. The logic circuit 11 which receives the abnormal signal transmitted from the overheat detection circuit 13 outputs an H-level signal to the gate of the NMOS transistor M3 to turn on the NMOS transistor M3. When the NMOS transistor M3 is turned on, a signal outputted from the gate drive circuit 12 is extracted, the gate of the output-stage switch M0 becomes an L level, and the output-stage switch M0 is turned off.

In addition, when the logic circuit 11 detects on the basis of a temperature state detection signal transmitted from the overheat detection circuit 13 that a rise in the temperature of the output-stage switch M0 is smaller than a threshold, the logic circuit 11 outputs an L-level signal to the gate of the NMOS transistor M1 to turn off the NMOS transistor M1. Moreover, when the logic circuit 11 detects on the basis of a temperature state detection signal transmitted from the overheat detection circuit 13 that a rise in the temperature of the output-stage switch M0 is greater than or equal to the threshold, the logic circuit 11 outputs an H-level signal to the gate of the NMOS transistor M1 to turn on the NMOS transistor M1.

In this case, the NMOS transistor M1 functions as a switching element for detecting an overheat state. If a rise in the temperature of the output-stage switch M0 is smaller than the threshold, then the NMOS transistor M1 is turned off and the ST terminal is pulled up to an H level. If a rise in the temperature of the output-stage switch M0 is greater than or equal the threshold, then the NMOS transistor M1 is turned on, the ST terminal is made an L level, and notice of an overheat state is given to the CPU 3.

On the other hand, the overcurrent detection circuit 14 and, for example, the output-stage switch M0 make up a current mirror circuit. The overcurrent detection circuit 14 generates the same current that flows through the output-stage switch M0. Furthermore, when the overcurrent detection circuit 14 detects that a current abnormally larger than a rated current flows, the overcurrent detection circuit 14 transmits an abnormal signal to the logic circuit 11.

The logic circuit 11 which receives the abnormal signal transmitted from the overcurrent detection circuit 14 outputs an H-level signal to the gate of the NMOS transistor M3 to turn on the NMOS transistor M3. When the NMOS transistor M3 is turned on, a signal outputted from the gate drive circuit 12 is extracted, the gate of the output-stage switch M0 becomes an L level, and the output-stage switch M0 is turned off.

Furthermore, when the logic circuit 11 detects on the basis of a current state detection signal transmitted from the overcurrent detection circuit 14 that a current flowing through the output-stage switch M0 is smaller than a threshold, the logic circuit 11 outputs an L-level signal to the gate of the NMOS transistor M1 to turn off the NMOS transistor M1. Moreover, when the logic circuit 11 detects on the basis of a current state detection signal transmitted from the overcurrent detection circuit 14 that a current flowing through the output-stage switch M0 is larger than or equal to the threshold, the logic circuit 11 outputs an H-level signal to the gate of the NMOS transistor M1 to turn on the NMOS transistor M1.

In this case, the NMOS transistor M1 functions as a switching element for detecting an overcurrent state. If a current flowing through the output-stage switch M0 is smaller than the threshold, the NMOS transistor M1 is turned off and the ST terminal is pulled up to an H level. If a current flowing through the output-stage switch M0 is larger than or equal the threshold, the NMOS transistor M1 is turned on, the ST terminal is made an L level, and notice of an overcurrent state is given to the CPU 3.

On the other hand, a line La which connects the gate of the NMOS transistor M2 and a connection point p0 of the other terminal of the resistor R1 and the other terminal of the resistor R2 functions as a disconnection detection line. If the L load 2 is short-circuited when the IN terminal is at an L level, then the OUT terminal becomes an L level and the L level is applied via the line La to the gate of the NMOS transistor M2. As a result, the NMOS transistor M2 is turned off. Accordingly, when the IN terminal is at the L level, the ST terminal becomes an H level. By doing so, the CPU 3 is informed of the short circuit of the L load 2.

The voltage detection circuit 15 monitors an overvoltage applied between the drain and the source of the output-stage switch M0. If the overvoltage is higher than or equal to a determined voltage, then the voltage application circuit 16 applies to the gate of the output-stage switch M0 a threshold voltage Vth2 higher than a threshold voltage Vth1 at the time of normal operation of the output-stage switch M0.

Figure 3:
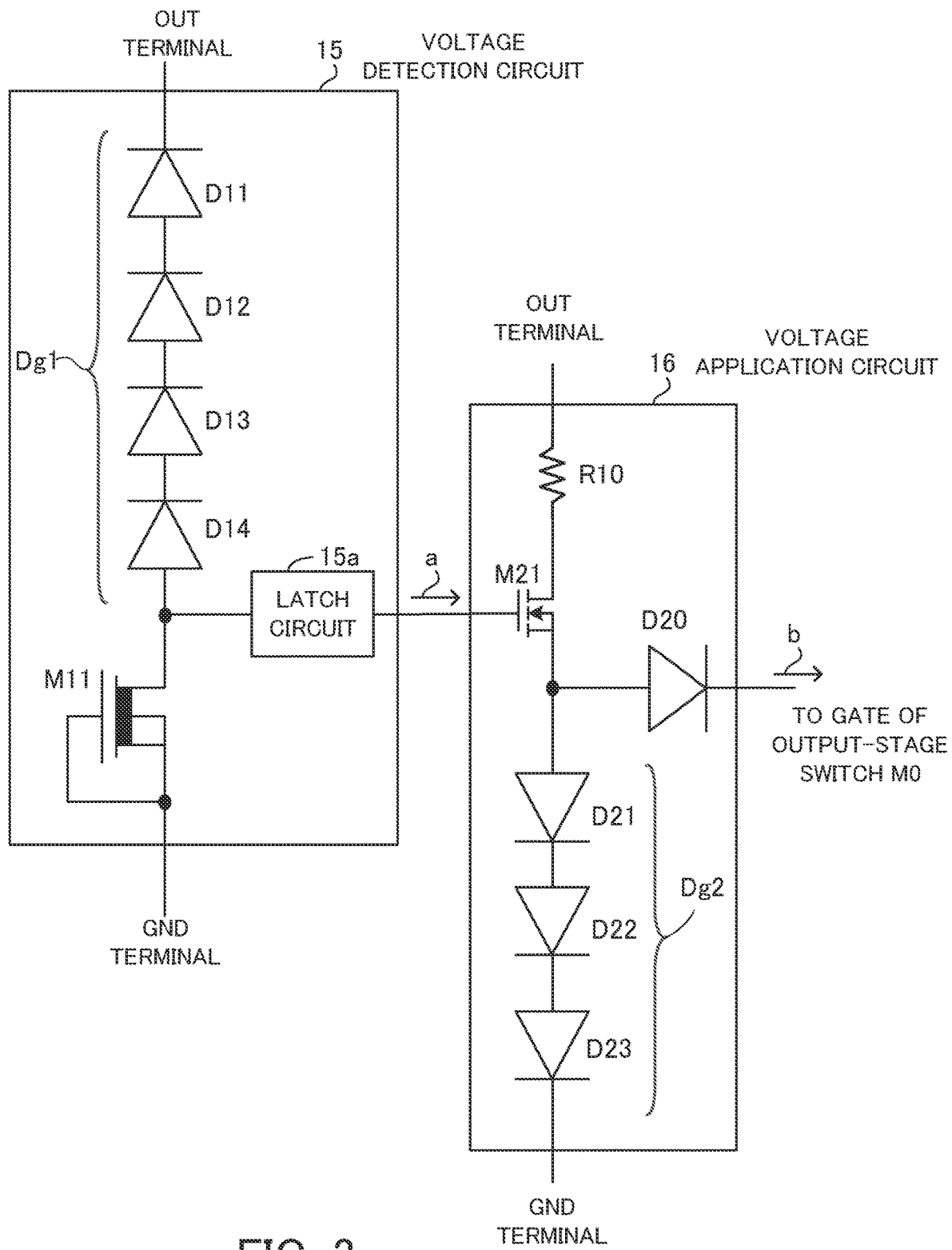
FIG. 3 illustrates an example of the internal structure of each of a voltage detection circuit and a voltage application circuit.

FIG. 3 illustrates an example of the internal structure of each of the voltage detection circuit and the voltage application circuit. The voltage detection circuit 15 includes a diode group Dg1 (first diode group), an NMOS transistor M11, and a latch circuit 15a. The voltage application circuit 16 includes a diode group Dg2 (second diode group), a resistor R10, an NMOS transistor M21, and a diode D20 (output diode). The diode group Dg1 includes diodes D11, . . . , and D14 (plurality of first diodes) and the diode group Dg2 includes diodes D21, D22, and D23 (plurality of second diodes).

A method for connecting each component will be described. The diodes D11, . . . , and D14 are connected in series. A cathode of the diode D11 (cathode at a first end portion of the first diode group) is connected to the OUT terminal (drain of the output-stage switch M0 and the one terminal of the L load 2). An anode of the diode D11 is connected to a cathode of the diode D12. An anode of the diode D12 is connected to a cathode of the diode D13. Furthermore, an anode of the diode D13 is connected to a cathode of the diode D14.

An anode of the diode D14 (anode at a second end portion of the first diode group) is connected to a drain of the NMOS transistor M11 and an input terminal of the latch circuit 15a. A gate of the NMOS transistor M11 is connected to a source of the NMOS transistor M11 and the GND terminal. The NMOS transistor M11 is a depletion-type MOSFET in which the gate and the source are short-circuited. Even if a gate-source voltage is 0, a current flows between the drain and the source (NMOS transistor M11 functions as a constant-current source).

One terminal of the resistor R10 is connected to the OUT terminal and the other terminal of the resistor R10 is connected to a drain of the NMOS transistor M21. A gate of the NMOS transistor M21 is connected to an output terminal of the latch circuit 15a.

A source of the NMOS transistor M21 is connected to an anode of the diode D20 and an anode of the diode D21 (anode at a third end portion of the second diode group). A cathode of the diode D20 is connected to the gate of the output-stage switch M0 illustrated in FIG. 2 and the output terminal of the gate drive circuit 12 illustrated in FIG. 2.

A cathode of the diode D21 is connected to an anode of the diode D22 and a cathode of the diode D22 is connected to an anode of the diode D23. A cathode of the diode D23 (cathode at a fourth end portion of the second diode group) is connected to the GND terminal.

If the voltage detection circuit 15 detects that an overvoltage based on back electromotive force generated in the L load 2 at turn-off time which follows a turn-on of the output-stage switch M0 is higher than or equal to a determined voltage of a clamp voltage, then the voltage detection circuit 15 outputs an H-level detection signal a.

If the overvoltage is higher than or equal to the determined voltage and the voltage application circuit 16 receives the H-level detection signal a outputted from the voltage detection circuit 15, then the voltage application circuit 16 applies at high speed to the gate of the output-stage switch M0 a voltage signal b having the threshold voltage Vth2 higher than the threshold voltage Vth1 at normal operation time to turn on the output-stage switch M0.

Figure 4:
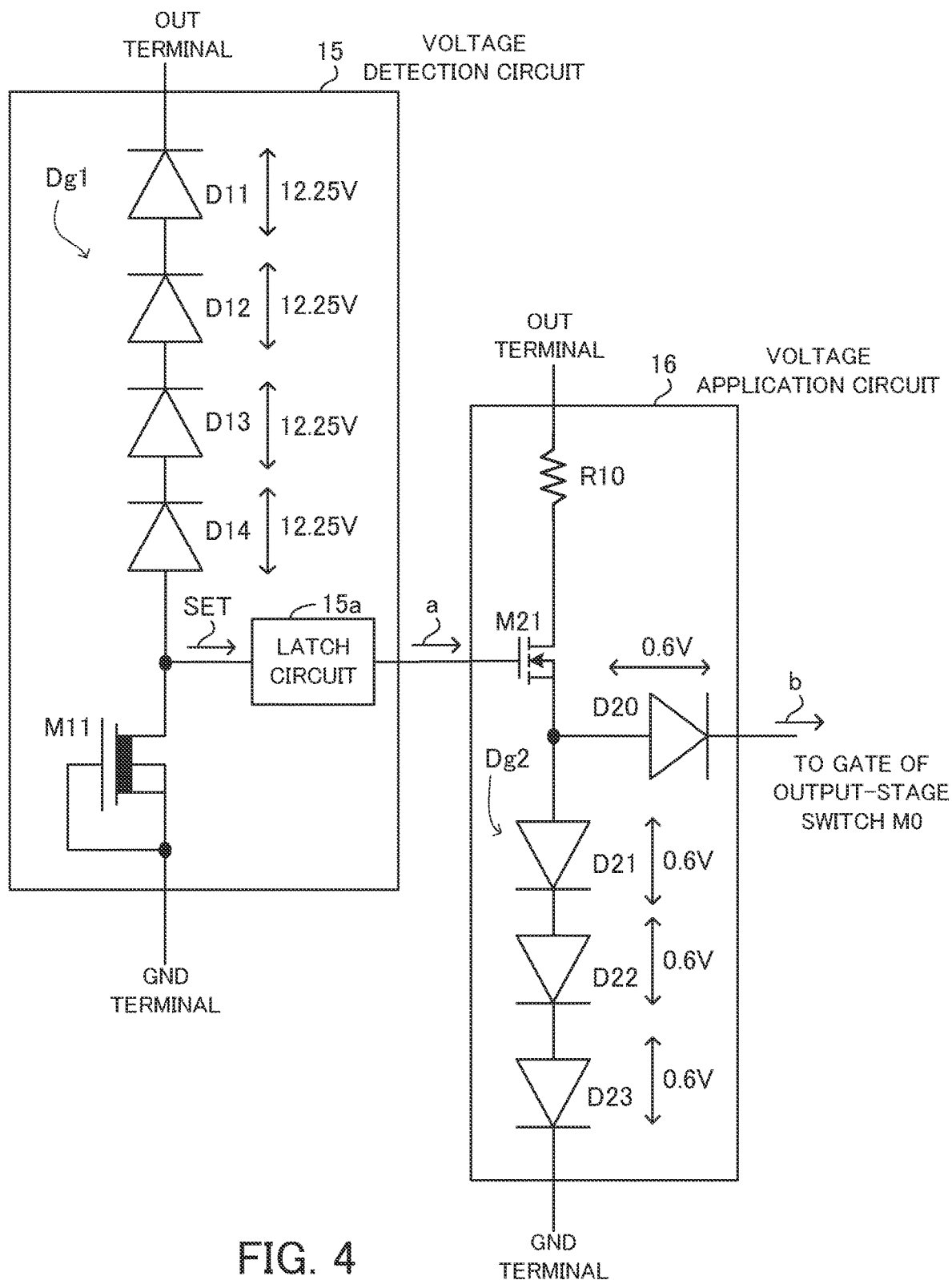
FIG. 4 illustrates an example of dividing a voltage among diodes.

FIG. 4 illustrates an example of dividing a voltage among diodes. It is assumed that a clamp voltage applied between the OUT terminal and the GND is 50 volts, that the breakdown voltage of the diode group Dg1 is 49 volts, and that the threshold voltage Vth1 of the output-stage switch M0 is 1 volt.

It is assumed that a reverse voltage Vr of each of the diodes D11, . . . , and D14 is 12.25 volts. In this case, a voltage applied to the anode of the diode D14 and the drain of the NMOS transistor M11 is 1 volt (=50 volts−12.25 volts×4). At this time, a set signal SET is inputted to the input terminal (set input terminal) of the latch circuit 15a. When the set signal SET is inputted, the latch circuit 15a latch-outputs an H-level detection signal a and applies it to the gate of the NMOS transistor M21.

On the other hand, it is assumed that a forward voltage Vf of each of the diodes D21, D22, and D23 and the diode D20 is 0.6 volts. When the H-level detection signal a is applied to the gate of the NMOS transistor M21, the NMOS transistor M21 is turned on. At this time, a voltage applied to the source of the NMOS transistor M21 is 1.8 volts (=0.6 volts×3). Furthermore, because the forward voltage Vf of the diode D20 is also 0.6 volts, a voltage of the cathode of the diode D20 is 1.2 volts (=1.8 volts−0.6 volts) and a 1.2-volt voltage signal b is applied to the gate of the output-stage switch M0.

If a threshold voltage of the output-stage switch M0 at normal operation time is 1 volt and the upper limit value of variation in threshold voltages of minute MOSes which make up the output-stage switch M0 is, for example, 0.1 volt, then a voltage of 1.1 volts or more is needed to turn on all the minute MOSes.

Accordingly, in the above example a voltage of 1.2 volts is applied to the gate of the output-stage switch M0 in order to handle energy stored in the L load 2 at the time of a voltage across the L load 2 being clamped. A voltage of 1.1 volts or more is forcedly applied in this way at the time of a voltage across the L load 2 being clamped. By doing so, all the minute MOSes which make up the output-stage switch M0 are reliably turned on and energy stored in the L load 2 is handled by the whole of the gate of the output-stage switch M0. This improves clamp resistance.

Because the diode size of the diode group Dg1 may variably be set, a determined voltage (49 volts in the above example) of a clamp voltage may flexibly be adjusted. Furthermore, because the diode size of the diode group Dg2 or the diode D20 may variably be set, the threshold voltage Vth2 may flexibly be adjusted. In addition, the above structure may be combined with a power device such as an insulated gate bipolar transistor (IGBT).

Figure 5:
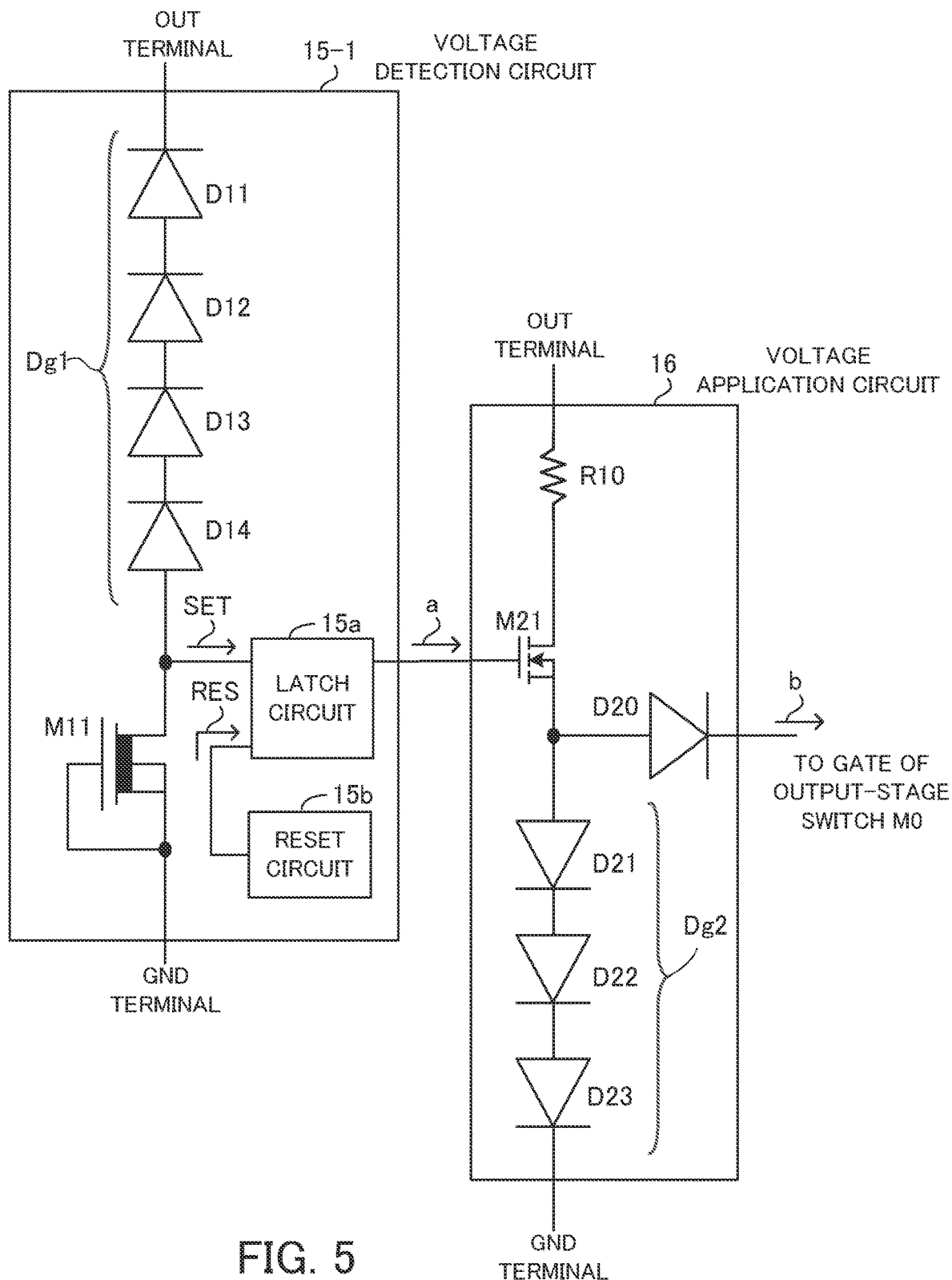
FIG. 5 illustrates an example of the structure of a voltage detection circuit including a reset circuit.

FIG. 5 illustrates an example of the structure of a voltage detection circuit including a reset circuit. A voltage detection circuit 15-1 includes a diode group Dg1, an NMOS transistor M11, a latch circuit 15a, and a reset circuit 15b.

When the reset circuit 15b detects that a clamp voltage is lower than the breakdown voltage of the diode group Dg1, the reset circuit 15b outputs a reset signal RES to release latch operation of the latch circuit 15a. When the latch circuit 15a receives the reset signal RES, the latch circuit 15a releases its latch operation and stops outputting an H-level detection signal a (changes the detection signal a from an H level to an L level).

Figure 6:
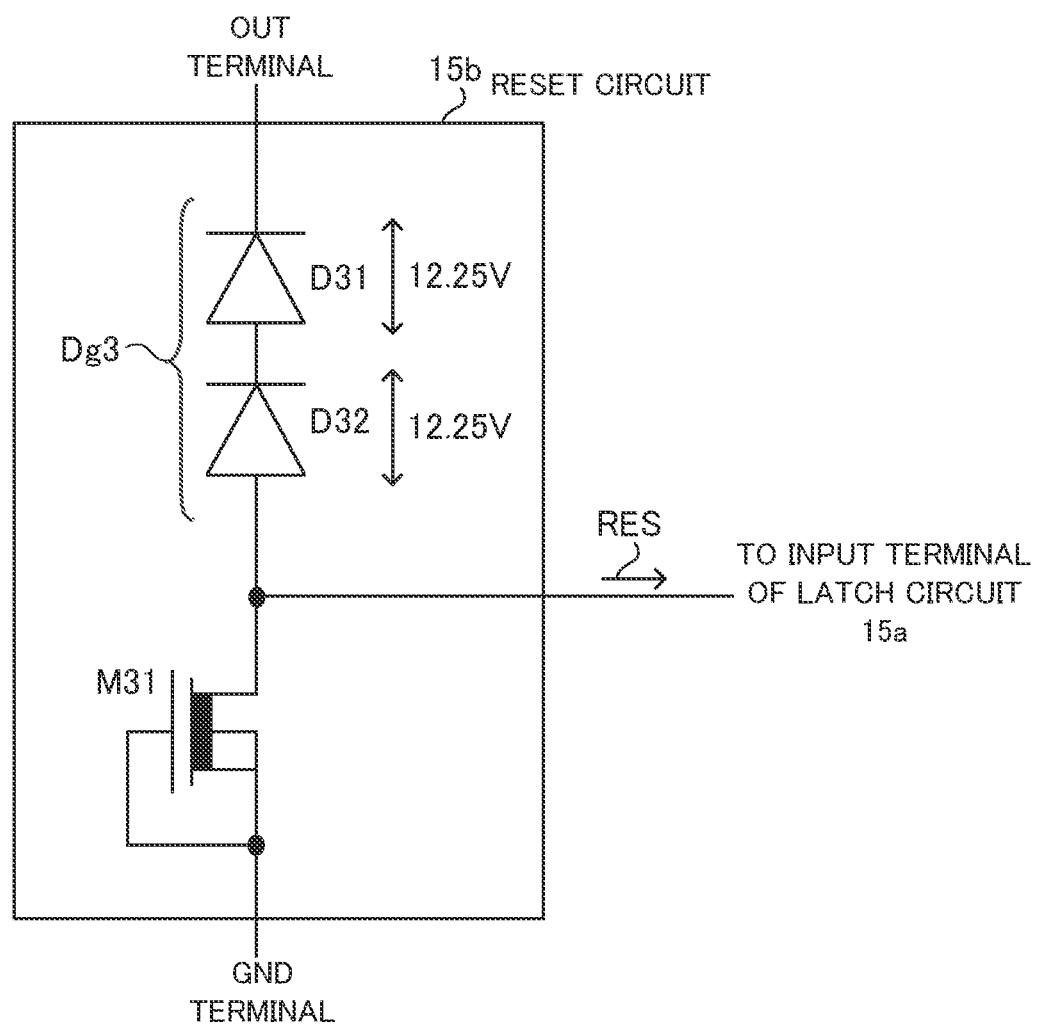
FIG. 6 illustrates an example of the internal structure of the reset circuit.
Figure 7:
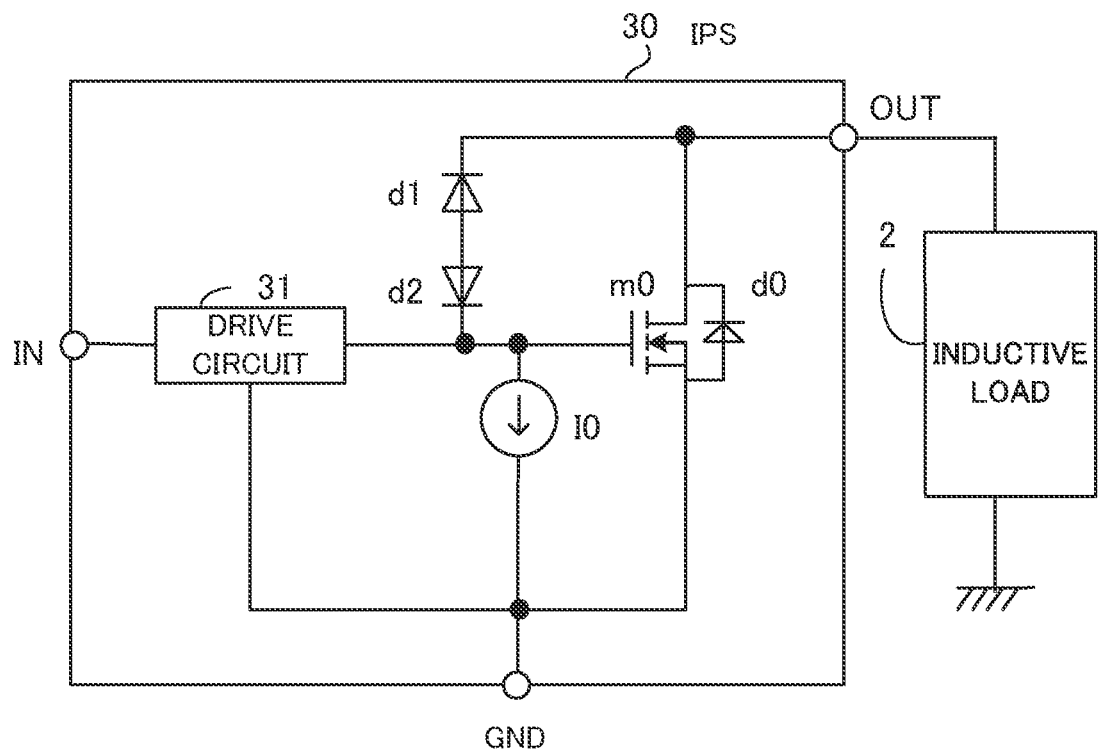
FIG. 7 illustrates an example of the structure of a conventional IPS.
Figure 8:
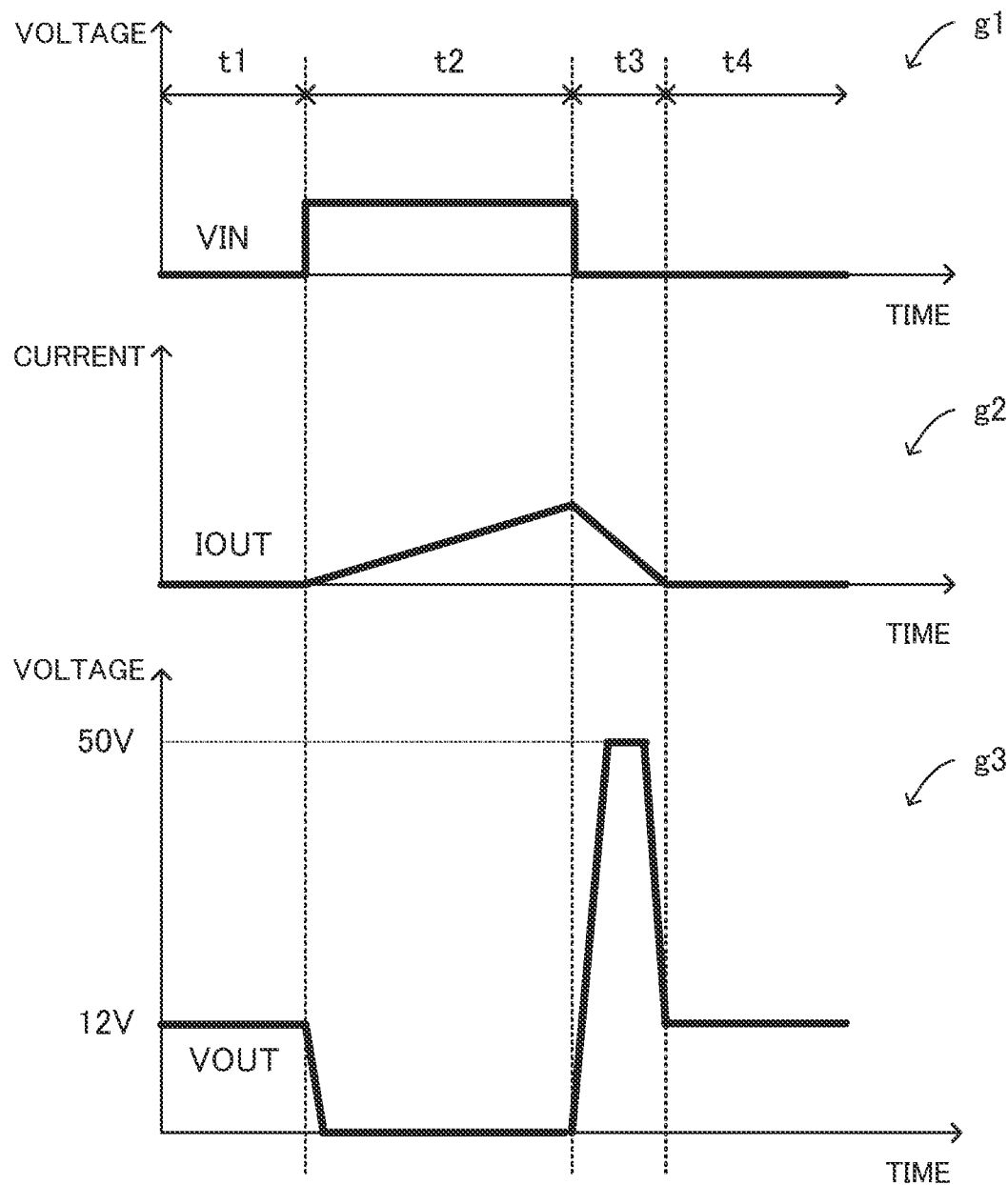
FIG. 8 illustrates an example of an operational waveform of the conventional IPS.
Figure 9:
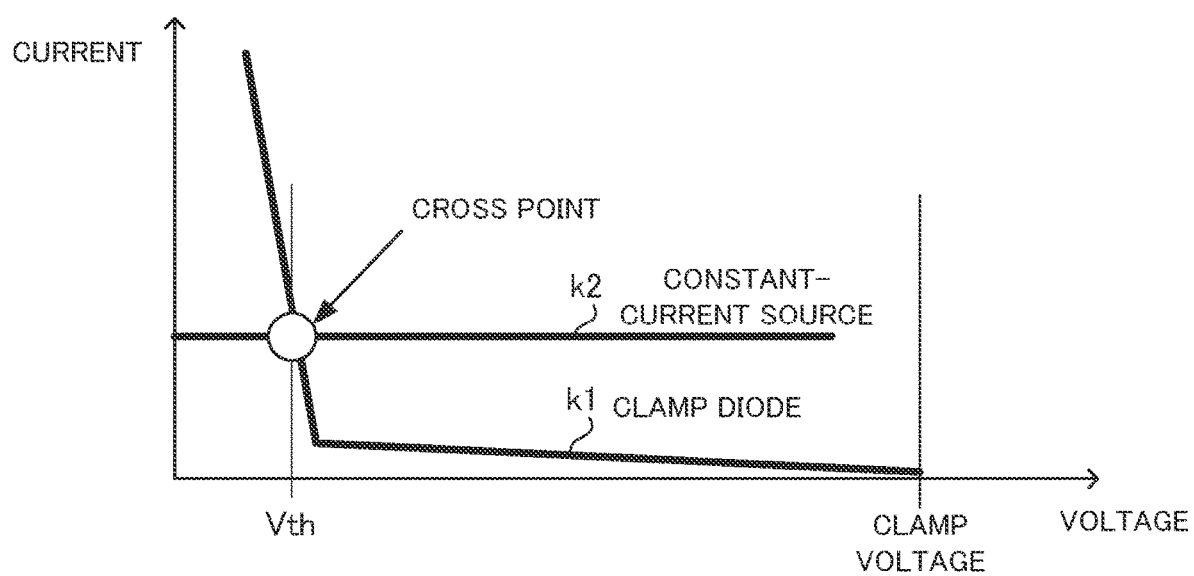
FIG. 9 is a view for describing an example of determining a clamp voltage.
Figure 10:
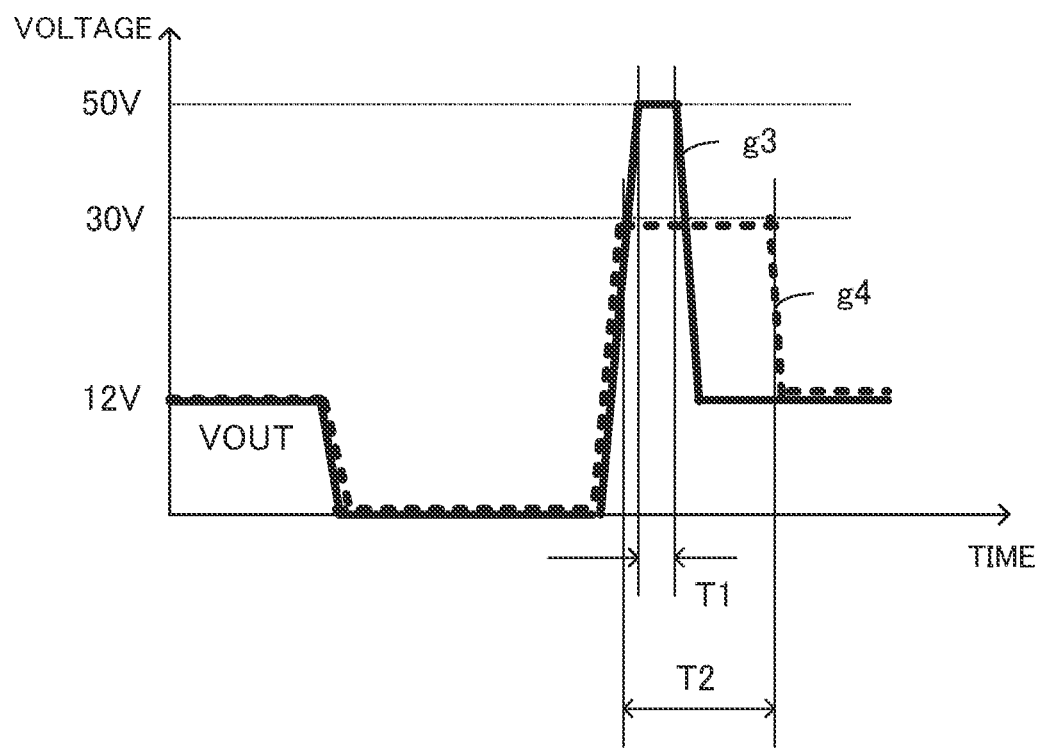
FIG. 10 illustrates the relationship between a clamp voltage and time taken to handle energy stored in an L load.
Figure 11:
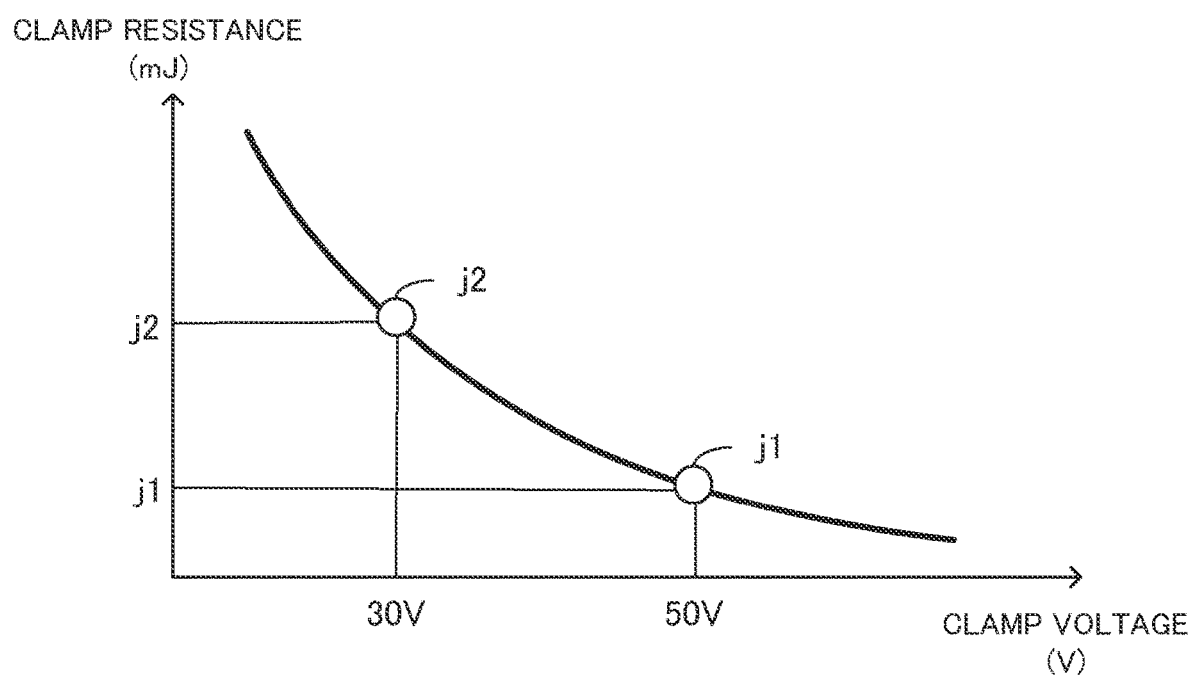
FIG. 11 illustrates the relationship between a clamp voltage and clamp resistance.
Figure 12:
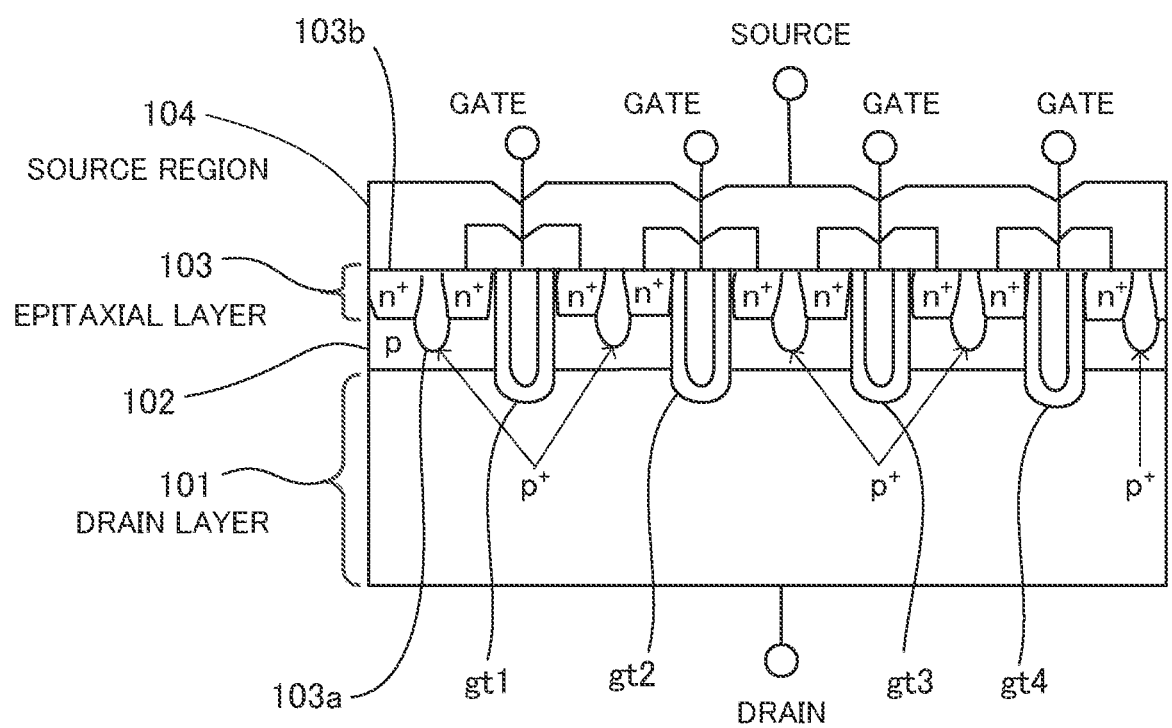
FIG. 12 illustrates an example of the structure of a section of an output-stage switch.
Figure 13:
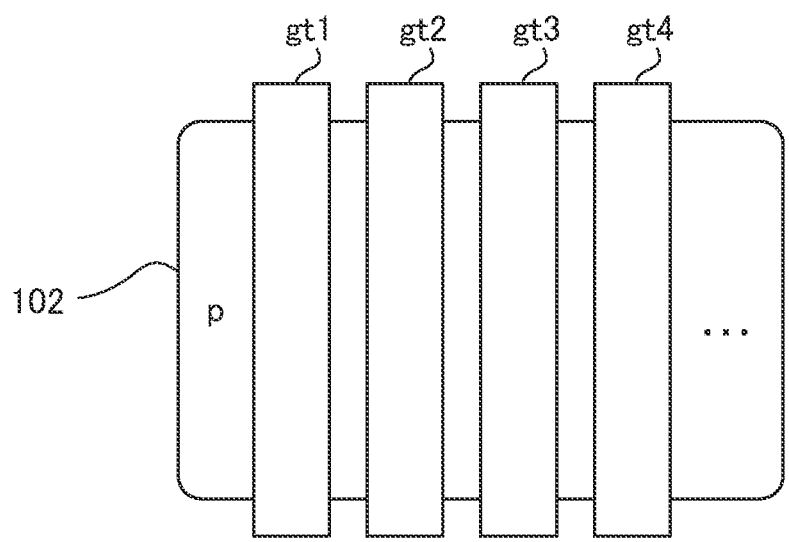
FIG. 13 illustrates an example of the arrangement of gate trenches of the output-stage switch.

FIG. 6 illustrates an example of the internal structure of the reset circuit. The reset circuit 15b includes a diode group Dg3 (third diode group) and an NMOS transistor M31 (reset constant-current source). The diode group Dg3 (third diode group) includes diodes D31 and D32 (third diodes).

The diodes D31 and D32 are connected in series. A cathode of the diode D31 (cathode at a fifth end portion of the third diode group) is connected to the OUT terminal and an anode of the diode D31 is connected to a cathode of the diode D32. Furthermore, anode of the diode D32 (anode at a sixth end portion of the third diode group) is connected to an input terminal of the latch circuit 15a and a drain of the NMOS transistor M31. A gate of the NMOS transistor M31 is connected to a source of the NMOS transistor M31 and the GND terminal.

It is assumed that a clamp voltage applied between the OUT terminal and the GND is 50 volts and that the breakdown voltage of the diode group Dg3 is 24.5 volts. It is assumed that a reverse voltage Vr of each of the diodes D31 and D32 is 12.25 volts. In this case, a voltage applied to the anode of the diode D32 and the drain of the NMOS transistor M31 is 25.5 volts (=50 volts−12.25 volts×2). At this time, a reset signal RES is outputted to the input terminal (reset input terminal) of the latch circuit 15a.

As stated above, the reset circuit 15b sets the breakdown voltage of the diode group Dg3 to a value lower than the breakdown voltage of the diode group Dg2. By doing so, the reset circuit 15b detects that a clamp voltage has fallen, and outputs a reset signal RES to release latch operation of the latch circuit 15a.

The embodiment has been taken as an example. The structure of each section indicated in each embodiment may be replaced by another structure having the same function. Furthermore, any other component or process may be added. Moreover, the structures (features) of any two or more of the above embodiment may be combined.

According to an aspect, clamp resistance is increased.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device for driving an inductive load, the semiconductor device comprising:
    an output-stage switch which is connected to the inductive load and which switches on and off to operate the inductive load, the output-stage switch having a gate, a drain, and a source;
    a voltage detection circuit configured to output a detection signal responsive to an overvoltage, corresponding to a back electromotive force generated in the inductive load at a turn-off time that follows a turn-on of the output-stage switch, being higher than or equal to a clamp voltage;
    a drive circuit configured to apply a drive signal having a first threshold voltage to the gate of the output-stage switch to turn on the output-stage switch; and
    a voltage application circuit configured to apply a voltage signal having a second threshold voltage higher than the first threshold voltage to the gate of the output-stage switch, responsive to the overvoltage being higher than or equal to the clamp voltage and upon receiving the detection signal from the voltage detection circuit, to turn on the output-stage switch, wherein:
    the inductive load has a first terminal and a second terminal;
    the voltage detection circuit includes
        a first diode group including a plurality of first diodes connected in series, to thereby have an anode at a first end of the second diode group and a cathode at a second end of the second diode group,
        a constant-current source having an input terminal and an output terminal, and
        a latch circuit having a first input terminal, a second input terminal, and an output terminal; and
    the voltage application circuit includes
        a resistor having a first terminal and a second terminal,
        a metal-oxide-semiconductor (MOS) transistor having a drain, a source, and a gate,
        a second diode group including a plurality of second diodes connected in series, to thereby have an anode at a first end of the second diode group and a cathode at a second end of the second diode group, and
        an output diode having an anode and a cathode; wherein
    the cathode at the first end of the first diode group is connected to the drain of the output-stage switch and the first terminal of the inductive load, the anode at the second end of the first diode group is connected to the input terminal of the constant-current source and the first input terminal of the latch circuit, and the output terminal of the constant-current source is connected to a ground; and the first terminal of the resistor is connected to the drain of the output-stage switch and the first terminal of the inductive load, the second terminal of the resistor is connected to the drain of the MOS transistor, the gate of the MOS transistor is connected to the output terminal of the latch circuit, the source of the MOS transistor is connected to the anode at the first end of the second diode group and the anode of the output diode, the cathode at the second end of the second diode group is connected to the ground, and the cathode of the output diode is connected to the gate of the output-stage switch.

2. The semiconductor device according to claim 1, wherein:

when a breakdown voltage of the first diode group reaches the clamp voltage, a set signal is inputted from the anode at the second end of the first diode group to the first input terminal of the latch circuit; and when the latch circuit receives the set signal, the latch circuit latch-outputs the detection signal.

3. The semiconductor device according to claim 1, wherein:

when the MOS transistor is turned on by the detection signal, a voltage based on a fall in a forward voltage of the second diode group is applied to the output diode; and the voltage signal is obtained by subtracting a forward voltage of the output diode from the voltage, and is applied as the second threshold voltage to the gate of the output-stage switch.

4. The semiconductor device according to claim 1, wherein:

the voltage detection circuit further includes a reset circuit, the reset circuit including a third diode group including a plurality of third diodes connected in series, to thereby have a cathode at a first end of the third diode group and an anode at a second end of the third diode group, and a reset constant-current source having an input terminal and an output terminal; and the cathode at the first end of the third diode group is connected to the drain of the output-stage switch and the first terminal of the inductive load, the anode at the second end of the third diode group is connected to the input terminal of the reset constant-current source and the second input terminal of the latch circuit, and the output terminal of the reset constant-current source is connected to the ground.

5. The semiconductor device according to claim 4, wherein:

a size of the third diode group is set so that a breakdown voltage of the third diode group is lower than a breakdown voltage of the first diode group; and when the third diode group breaks down, the reset circuit outputs a reset signal to release a latch-output of the detection signal by the latch circuit.

* * * * *